United States Patent
Oku (10) Patent No.: US 10,263,567 B2
(45) Date of Patent: Apr. 16, 2019

(54) AMPLIFIER CIRCUIT

(71) Applicant: FUJITSU COMPONENT LIMITED, Tokyo (JP)

(72) Inventor: Hideki Oku, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 0 days.

(21) Appl. No.: 15/887,285

(22) Filed: Feb. 2, 2018

(65) Prior Publication Data

US 2018/0241353 A1  Aug. 23, 2018

(30) Foreign Application Priority Data

Feb. 17, 2017 (JP) .................. 2017-027667

(51) Int. Cl.
| | |
|---|---|
| *H03F 1/08* | (2006.01) |
| *H03F 3/19* | (2006.01) |
| *H03F 1/02* | (2006.01) |
| *H03F 3/08* | (2006.01) |
| *H03F 3/343* | (2006.01) |
| *H03F 3/45* | (2006.01) |
| *H03F 3/50* | (2006.01) |

(52) U.S. Cl.
CPC .......... *H03F 1/083* (2013.01); *H03F 1/0216* (2013.01); *H03F 1/0272* (2013.01); *H03F 3/08* (2013.01); *H03F 3/19* (2013.01); *H03F 3/3432* (2013.01); *H03F 3/45475* (2013.01); *H03F 3/50* (2013.01); *H03F 2203/45528* (2013.01)

(58) Field of Classification Search
CPC ..................................................... H03F 1/083
See application file for complete search history.

(56) References Cited

U.S. PATENT DOCUMENTS

| | | | | |
|---|---|---|---|---|
| 3,473,137 | A * | 10/1969 | Stern ..................... | H03K 5/02 330/110 |
| 3,510,685 | A * | 5/1970 | Kataoka ............... | H03K 19/013 326/128 |
| 3,510,791 | A * | 5/1970 | Nagata ................ | H03F 3/45071 330/261 |
| 3,939,470 | A * | 2/1976 | Arai ....................... | F01M 11/12 340/450 |
| 6,646,508 | B1 * | 11/2003 | Barbetta ................ | H03F 1/086 330/264 |
| 9,509,259 | B2 | 11/2016 | Oku | |
| 9,755,589 | B2 * | 9/2017 | Oku ......................... | H03F 3/08 |
| 2018/0219517 | A1 * | 8/2018 | Nagatani .................. | H03F 3/45 |

FOREIGN PATENT DOCUMENTS

| | | |
|---|---|---|
| JP | 2014-116851 | 6/2014 |
| JP | 2016-127496 | 7/2016 |

* cited by examiner

*Primary Examiner* — Patricia T Nguyen
(74) *Attorney, Agent, or Firm* — IPUSA, PLLC (57) ABSTRACT

An amplifier circuit includes a first transistor; a first resistor to which a first potential is applied, the first resistor being connected to an emitter of the first transistor; a second resistor to which a second potential is applied, the second resistor being connected to a collector of the first transistor; and a signal control circuit configured to apply, to a base of the first transistor, a voltage that has been level-shifted based on an average value of a voltage at the collector of the first transistor, the signal control circuit being provided between the collector and the base of the first transistor.

5 Claims, 13 Drawing Sheets

$$Zmaxp = \frac{VT}{Ic-Imax + \frac{R2}{R1} \times Iave} = 17\Omega \quad < \quad Zmax = \frac{VT}{Ic-Imax} = 52\Omega$$

$$Zavep = \frac{VT}{Ic-Iave + \frac{R2}{R1} \times Iave} = 13\Omega \quad < \quad Zave = \frac{VT}{Ic-Iave} = 26\Omega$$

$$Zminp = \frac{VT}{Ic-Imin + \frac{R2}{R1} \times Iave} = 10\Omega \quad < \quad Zmin = \frac{VT}{Ic-Imin} = 17\Omega$$

AMPLIFIER CIRCUIT

CROSS-REFERENCE TO RELATED APPLICATION

The present application claims priority under 35 U.S.C. § 119 to Japanese Patent Application No. 2017-027667, filed on Feb. 17, 2017, the contents of which are incorporated herein by reference in their entirety.

BACKGROUND OF THE INVENTION

1. Field of the Invention

The present invention relates to an amplifier circuit.

2. Description of the Related Art

In order to implement large-capacity information communication, high-speed optical communication systems are becoming widespread. In an optical communication system, the received optical signals are converted into electric current signals by a photodiode, and the electric current signals output from the photodiode are converted into voltage signals and amplified by a transimpedance amplifier (TIA).

Patent Document 1: Japanese Unexamined Patent Application Publication No. 2014-116851

Patent Document 2: Japanese Unexamined Patent Application Publication No. 2016-127496

Incidentally, in the transimpedance amplifier, the input impedance varies depending on the magnitude of the input signal.

As described above, when the input impedance varies depending on the magnitude of the input signal, since the photodiode connected to the transimpedance amplifier includes a capacitance, the frequency characteristics are undesirably lowered.

Therefore, there is demand for a transimpedance amplifier in which the input impedance does not change even if the magnitude of the input signal changes.

SUMMARY OF THE INVENTION

The present invention provides an optical window member in which one or more of the above-described disadvantages are eliminated.

An embodiment of the present invention provides an amplifier circuit including a first transistor; a first resistor to which a first potential is applied, the first resistor being connected to an emitter of the first transistor; a second resistor to which a second potential is applied, the second resistor being connected to a collector of the first transistor; and a signal control circuit configured to apply, to a base of the first transistor, a voltage that has been level-shifted based on an average value of a voltage at the collector of the first transistor, the signal control circuit being provided between the collector and the base of the first transistor.

DETAILED DESCRIPTION OF THE PREFERRED EMBODIMENTS

Embodiments for carrying out the present invention will be described below. Note that the same elements, etc., are denoted by the same reference numerals, and overlapping descriptions are omitted. In the following description, specific numerical values will be exemplified as a matter of convenience; however, the present invention is not limited to the exemplified numerical values.

A transimpedance amplifier as an amplifier circuit will be described with reference to FIG. 1. The amplifier circuit of FIG. 1 includes one transistor 910, a first resistor 921, and a second resistor 922. The first resistor 921 is connected to the emitter of the transistor 910, and the second resistor 922 is connected to the collector of the transistor 910. The other terminal of the first resistor 921 is connected to a first potential Vee and the other terminal of the second resistor 922 is connected to a second potential Vcc. A bias power supply 930 is connected to the base of the transistor 910. Input signals are input from an input terminal 971 connected between the emitter of the transistor 910 and the first resistor 921, and output signals are output from an output terminal 972 connected between the collector of the transistor 910 and the second resistor 922.

Next, the relationship between the input signal and the input impedance in the amplifier circuit illustrated in FIG. 1 will be described with reference to FIGS. 2A and 2B. FIG. 2A illustrates the temporal changes in an input current Iin that are input signals, and FIG. 2B illustrates the changes in input impedance Zin of the amplifier circuit according to the changes in the input current Iin. The maximum value of the input current Iin is Imax, the minimum value of the input current Iin is Imin, and the average value of the input current Iin is Iave. The input impedance Zin and the input current Iin have a relationship expressed by the following formula 1. Note that in formula 1, Ic is the collector current when there is no input and VT is the thermal voltage.

$$Zin = \frac{VT}{Ic - Iin} \quad \text{[Formula 1]}$$

From formula 1, a maximum value Zmax of the input impedance at the maximum value Imax of the input current Iin, an average value Zave of the input impedance at the average value Iave of the input current Iin, and a minimum value Zmin of the input impedance at the minimum value Imin of the input current Iin, are expressed by formula 2.

$$\begin{cases} Zmax = \dfrac{VT}{Ic - Imax} = 52\Omega \\ Zave = \dfrac{VT}{Ic - Iave} = 26\Omega \\ Zmin = \dfrac{VT}{Ic - Imin} = 17\Omega \end{cases} \quad \text{[Formula 2]}$$

Here, the resistance values of the first resistor 921 and the second resistor 922 are 400Ω, the first potential Vee is 0 V that is the ground potential, the second potential Vcc is 3.3 V, and the potential applied to the base of the transistor 910 by the bias power supply 930 is 1.5 V, and the collector current Ic flowing in this case is 2 mA.

Furthermore, the maximum value Imax is 1.5 mA, the average value Iave is 1.0 mA, and the minimum value Imin is 0.5 mA. Note that the thermal voltage of the transistor is approximately 26 mA at room temperature (300 K). When the maximum value Zmax of the input impedance, the average value Zave of the input impedance, and the minimum value Zmin of the input impedance in this case are calculated based on formula 2, the maximum value Zmax of the input impedance is 52Ω, the average value Zave of the input impedance is 26Ω, and the minimum value Zmin of the input impedance is 17Ω, and the maximum value of the input impedance is more than three times the minimum value, and the variation of the input impedance is large.

First Embodiment

Next, a transimpedance amplifier that is an amplifier circuit according to the first embodiment will be described.

Figure 3:
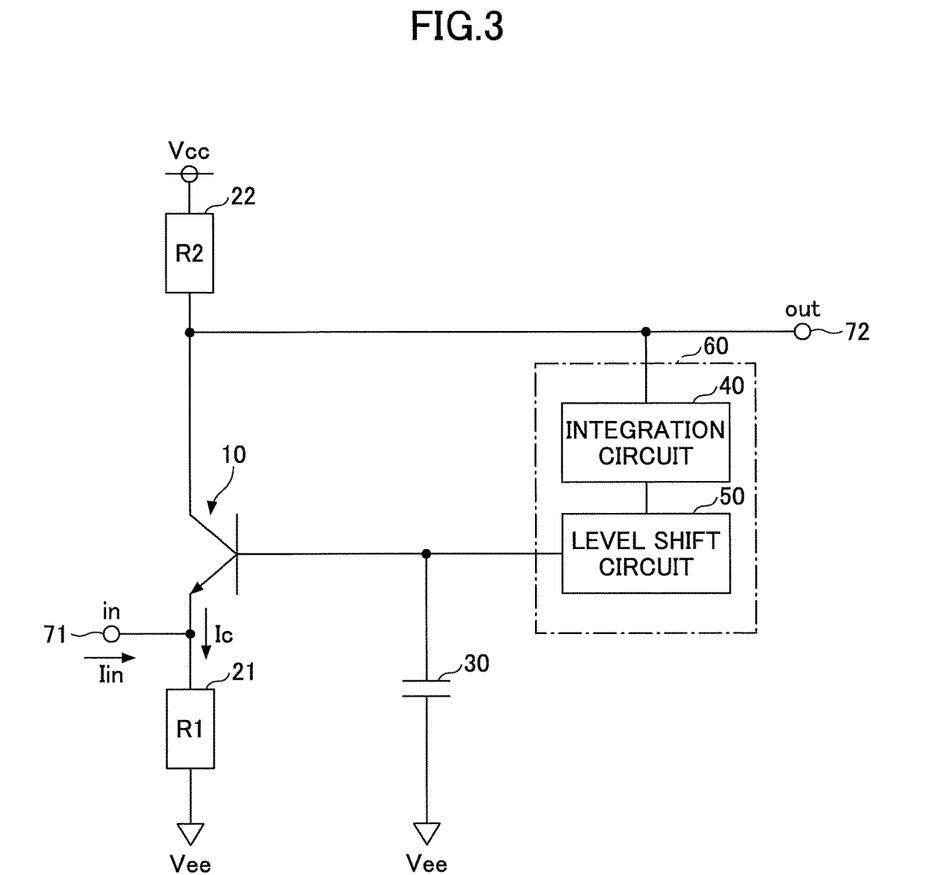
FIG. 3 is a circuit diagram of (1) an amplifier circuit according to a first embodiment of the present invention.

As illustrated in FIG. 3, the amplifier circuit according to the present embodiment includes a first transistor 10, a first resistor 21, a second resistor 22, a capacitor 30, an integration circuit 40, and a level shift circuit 50. The first resistor 21 is connected to the emitter of the first transistor 10, and the second resistor 22 is connected to the collector of the first transistor 10. The other terminal of the first resistor 21 is connected to a first potential Vee, and the other terminal of the second resistor 22 is connected to a second potential Vcc. The capacitor 30 is connected to the base of the first transistor 10, and the other terminal of the capacitor 30 is connected to the first potential Vee. The input signal is input from an input terminal 71 connected between the emitter of the first transistor 10 and the first resistor 21, and the output signal is output from an output terminal 72 connected between the collector of the first transistor 10 and the second resistor 22. Furthermore, the integration circuit 40 is connected to the collector of the first transistor 10 connected to the output terminal 72, and output of the integration circuit 40 is input to the level shift circuit 50. The level shift circuit 50 is connected to the base of the first transistor 10 and the capacitor 30. Note that in the present embodiment, a signal control circuit 60 is formed by the integration circuit 40 and the level shift circuit 50.

Figure 4A:
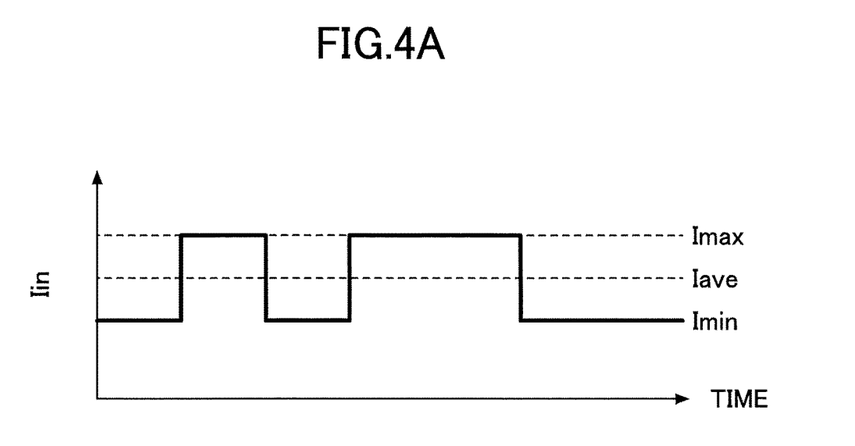
FIGS. 4A and 4B are diagrams for describing an input signal and input impedance in the amplifier circuit according to the first embodiment of the present invention.
Figure 4B:
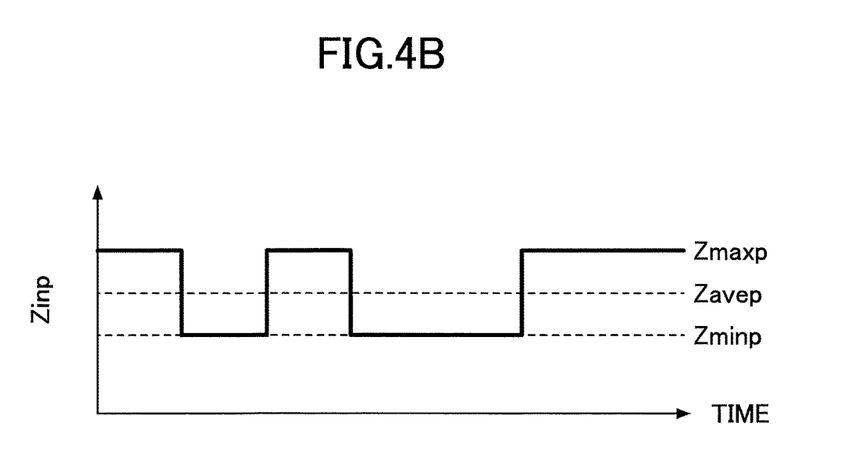

Next, the relationship between the input signal and the input impedance in the amplifier circuit according to the present embodiment will be described with reference to FIGS. 4A and 4B. FIG. 4A illustrates temporal changes in the input current Iin, and FIG. 4B illustrates the changes in input impedance Zinp according to changes in the input current Iin. In the amplifier circuit of FIG. 3, the input impedance Zinp and the input current Iin have a relationship expressed by the following formula 3.

$$Zinp = \dfrac{VT}{Ic - Iin + \dfrac{R2}{R1} \times Iave} \quad \text{[Formula 3]}$$

From formula 3, a maximum value Zmaxp of the input impedance at the maximum value Imax of the input current Iin, an average value Zavep of the input impedance at the average value Iave of the input current Iin, and a minimum value Zminp of the input impedance at the minimum value Imin of the input current Iin, are expressed by the following formula 4.

$$Zmaxp = \dfrac{VT}{Ic - Imax + \dfrac{R2}{R1} \times Iave} = 17\Omega \quad \text{[Formula 4]}$$

$$Zavep = \dfrac{VT}{Ic - Iave + \dfrac{R2}{R1} \times Iave} = 13\Omega$$

$$Zminp = \dfrac{VT}{Ic - Imin + \dfrac{R2}{R1} \times Iave} = 10\Omega$$

Here, the resistance values of the first resistor 21 and the second resistor 22 are 400Ω, the first potential Vee is 0 V that is the ground potential, the second potential Vcc is 3.3 V, the capacitance of the capacitor 30 is 100 pF, and the collector current Ic flowing in this case is 2 mA. Furthermore, the maximum value Imax of the input current Iin is 1.5 mA, the average value Iave of the input current Iin is 1.0 mA, and the minimum value Imin of the input current Iin is 0.5 mA. Note that the thermal voltage of the transistor is approximately 26 mA at room temperature (300 K).

Figure 1:
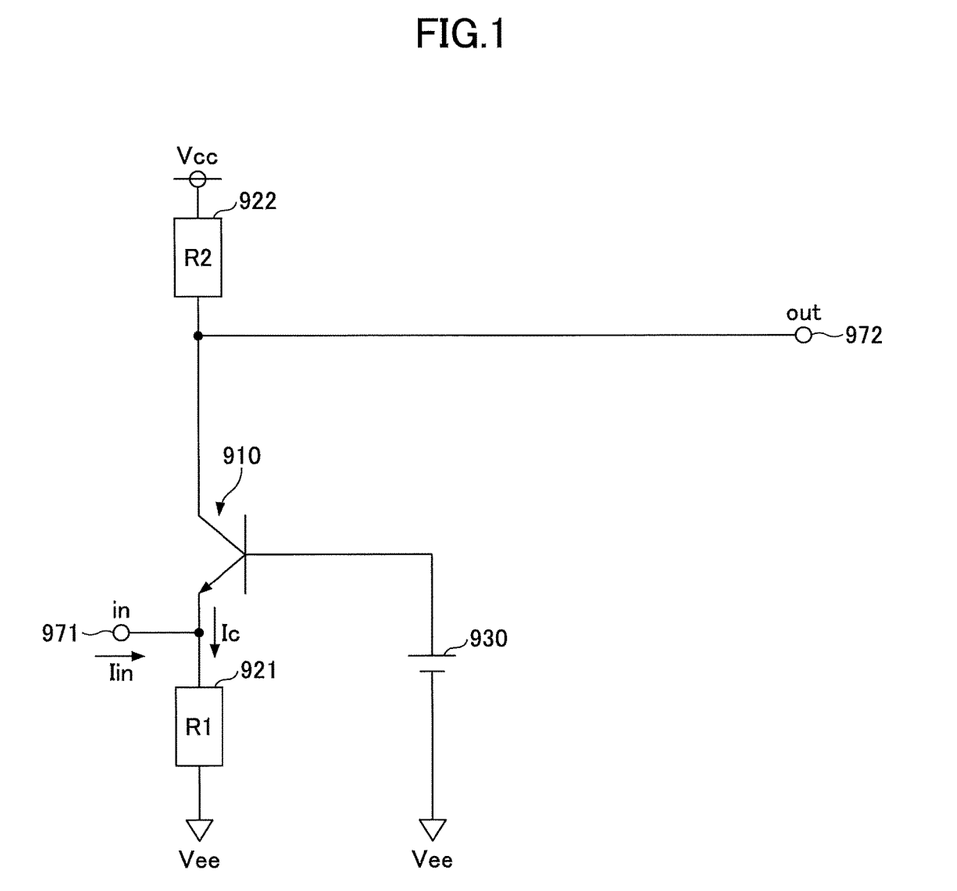
FIG. 1 is a circuit diagram of an amplifier circuit.
Figure 2A:
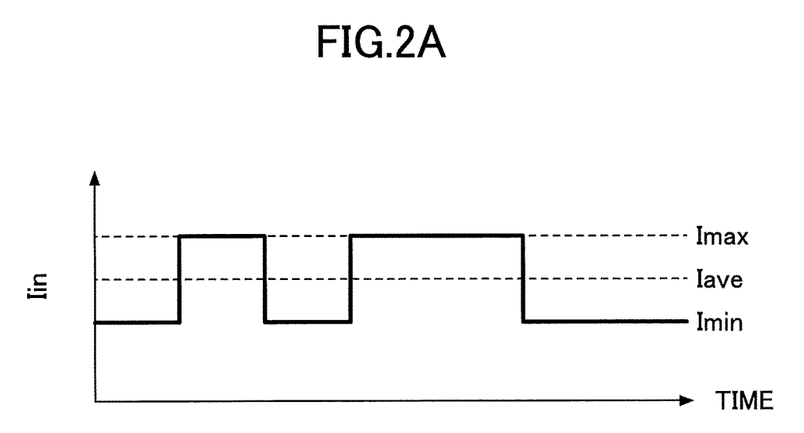
FIGS. 2A and 2B are diagrams for describing an input signal and input impedance in the amplifier circuit illustrated in FIG. 1.
Figure 2B:
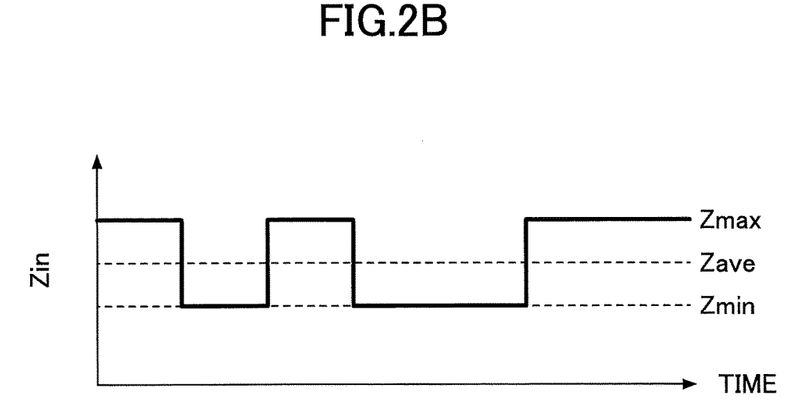

When the maximum value Zmaxp, the average value Zavep, and the minimum value Zminp of the input impedance in this case are calculated based on formula 4, the maximum value Zmaxp of the input impedance is 17Ω, the average value Zavep of the input impedance is 13Ω, and the minimum value Zminp of the input impedance is 10Ω, and the maximum value of the input impedance is 1.7 times the minimum value, and the variation of the input impedance can be reduced by approximately half compared with the amplifier circuit illustrated in FIG. 1.

Figure 5:
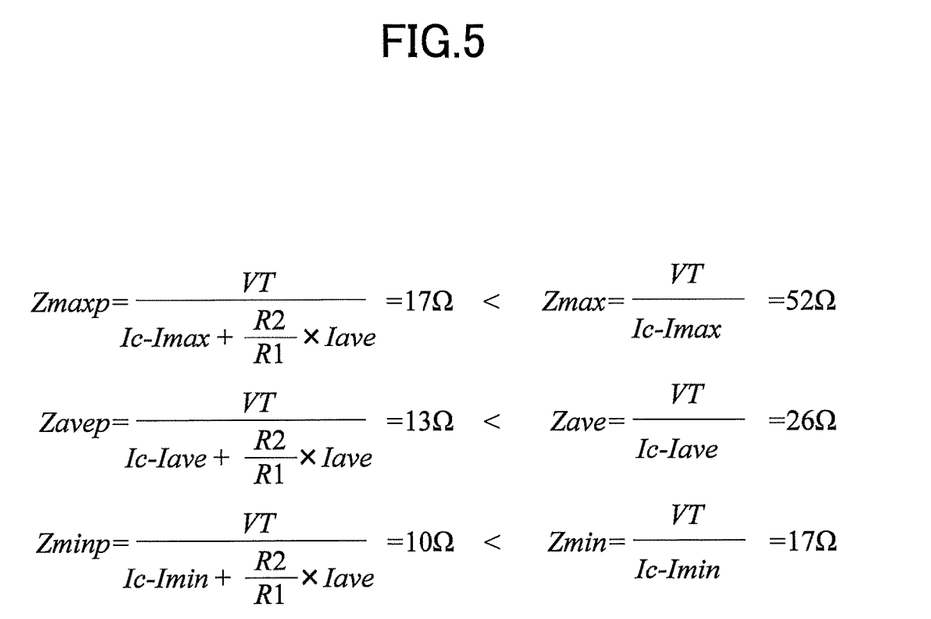
FIG. 5 illustrates the comparison between input impedances.

FIG. 5 illustrates the comparison between the input impedance of the amplifier circuit illustrated in FIG. 1 and the input impedance of the amplifier circuit according to the present embodiment. It can be seen that Zmaxp, Zavep, and Zminp of the amplifier circuit according to the present embodiment are respectively lower than Zmax, Zave, and Zmin of the amplifier circuit illustrated in FIG. 1.

Figure 6:
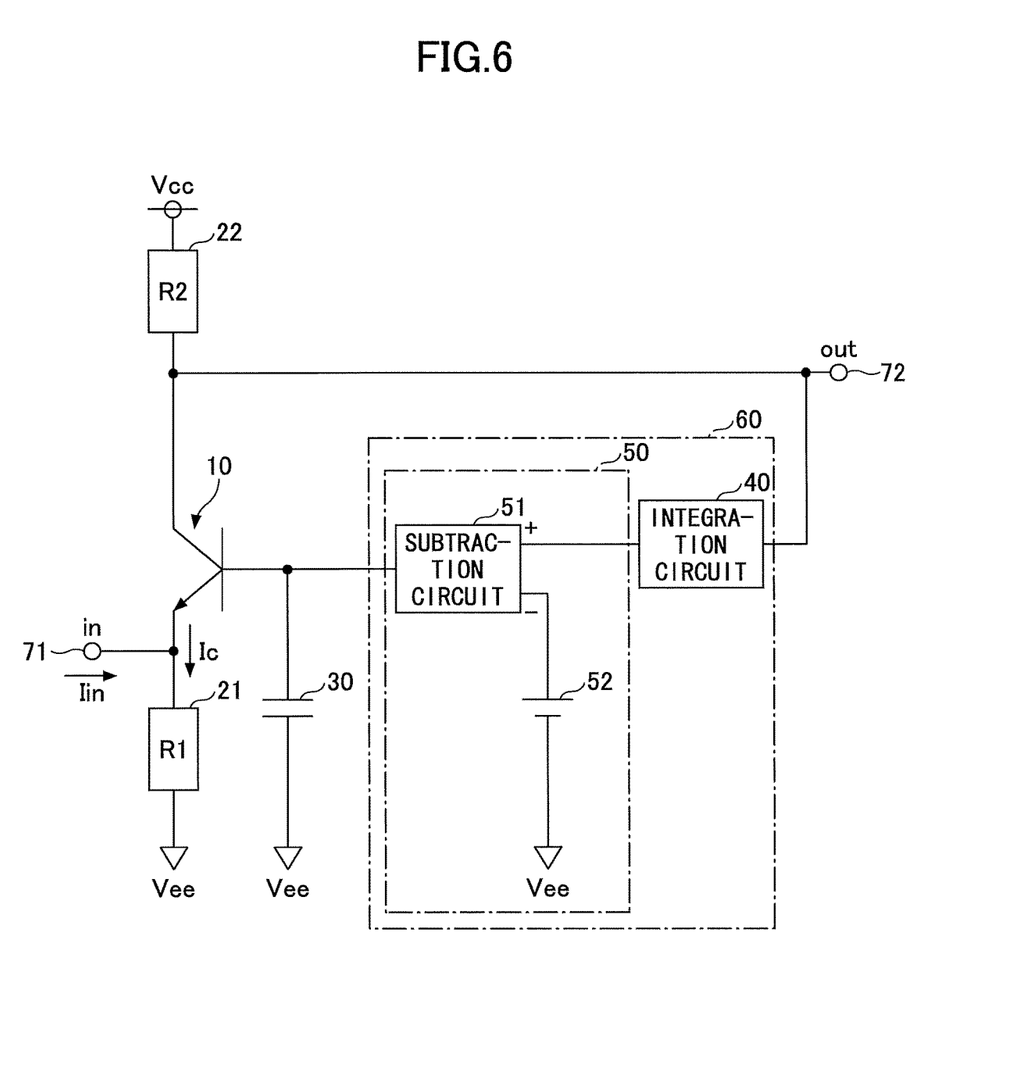
FIG. 6 is a circuit diagram (2) of an amplifier circuit according to the first embodiment of the present invention.

FIG. 6 is a circuit diagram in which the level shift circuit 50 is formed by a subtraction circuit 51 and a power supply 52. The output of the integration circuit 40 is connected to the + input terminal of the subtraction circuit 51, and 1 V, which is a third potential, is applied from the power supply 52 to the − input terminal of the subtraction circuit 51. Note that when there are no signals, the base potential of the first transistor 10 is approximately 1.5 V and the collector potential of the first transistor 10 is approximately 2.5 V.

Figure 7:
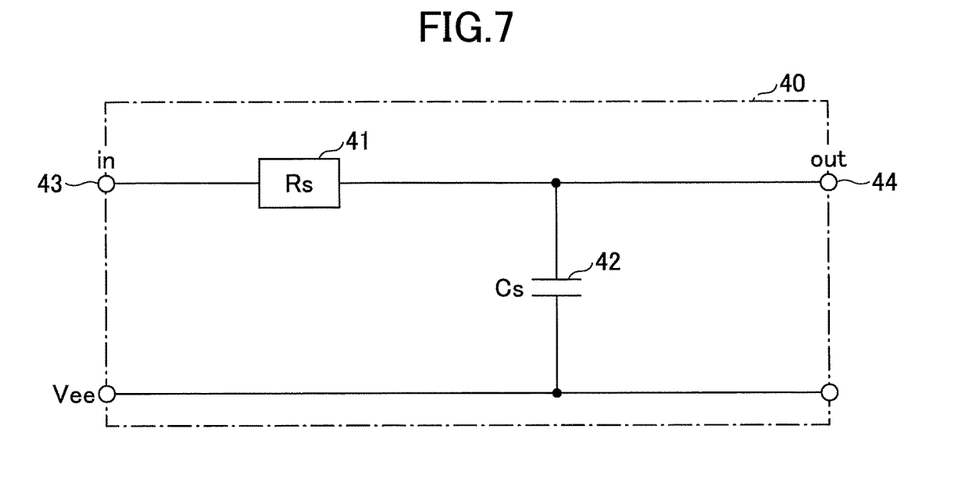
FIG. 7 is a circuit diagram (1) of an integration circuit.

Next, the integration circuit 40 will be described. As illustrated in FIG. 7, the integration circuit 40 may be a low-pass filter formed by a resistor 41 and a capacitor 42. The resistor 41 is connected to an input terminal 43 of the integration circuit 40. Furthermore, both the resistor 41 and the capacitor 42 are connected to an output terminal 44. The other terminal of the capacitor 42 is connected to the first potential Vee, which is the ground potential in the present embodiment. A cutoff frequency fc of the low-pass filter forming the integration circuit 40 illustrated in FIG. 7 is expressed by the following formula 5, where the resistance value of the resistor 41 is Rs and the capacitance of the capacitor 42 is Cs.

$$fc = \frac{1}{2\pi \cdot Cs \cdot Rs} \quad \text{[Formula 5]}$$

In the present embodiment, in order to set the cutoff frequency fc to 1 MHz, the resistance value Rs of the resistor 41 is set to 15.9 kΩ, and the capacitance Cs of the capacitor 42 is set to 10 pF.

Figure 8:
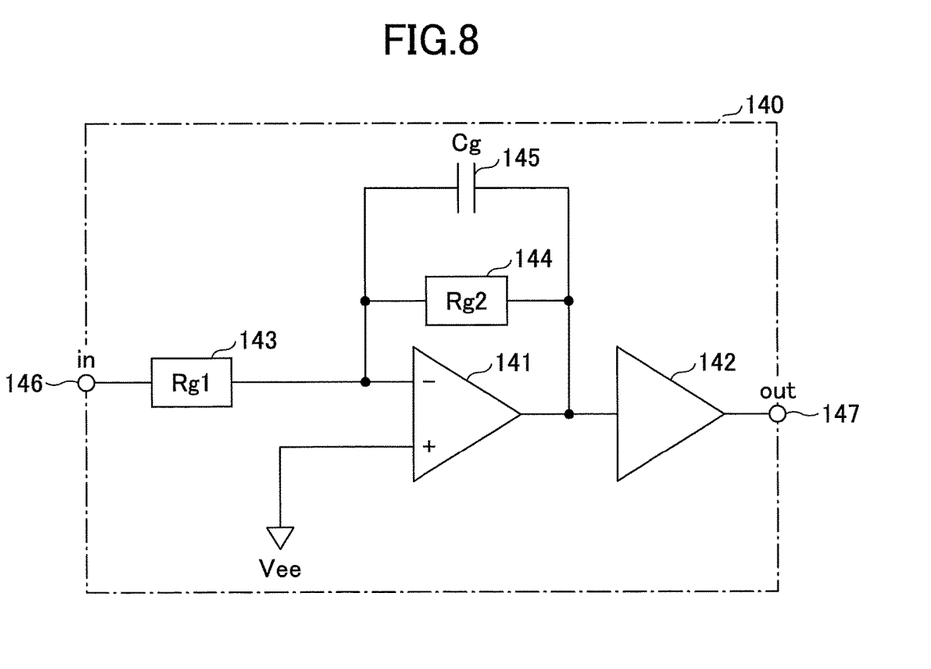
FIG. 8 is a circuit diagram (2) of an integration circuit.

Furthermore, the integration circuit may be an integration circuit 140 illustrated in FIG. 8. The integration circuit 140 is formed by two differential amplifier circuits 141 and 142, two resistors 143 and 144, and a capacitor 145. Note that the differential amplifier circuit is referred to as an operational amplifier.

An input terminal 146 of the integration circuit 140 is connected to the resistor 143, the other terminal of the resistor 143 is connected to an inverting input terminal (−) of the differential amplifier circuit 141, and to the resistor 144 and the capacitor 145. A noninverting input terminal (+) of the differential amplifier circuit 141 is connected to the ground potential that is the first potential Vee, and the output of the differential amplifier circuit 141 is connected to the other terminal of the resistor 144 and the other terminal of the capacitor 145, and also to the input of the differential amplifier circuit 142. The output of the differential amplifier circuit 142 is connected to an output terminal 147 of the integration circuit 140. The cut-off frequency fc of the low-pass filter forming the integration circuit 140 illustrated in FIG. 8 is expressed by the following formula 6, where the resistance value of the resistor 144 is Rg2, the capacitance of the capacitor 145 is Cg, and the gain is K. Furthermore, the gain K is expressed by formula 7, where the resistance value of the resistor 143 is Rg1.

$$fc = \frac{1}{2\pi \cdot Cg \cdot Rg2 \cdot K} \quad \text{[Formula 6]}$$

$$K = \frac{Rg2}{Rg1} \quad \text{[Formula 7]}$$

In the present embodiment, when the resistance value Rg1 of the resistor 143 is 10 kΩ and the resistance value Rg2 of the resistor 144 is 20 kΩ, the gain K becomes 2, and in order to set the cutoff frequency fc to 1 MHz, the capacitance Cg of the capacitor 145 is set to 4 pF.

Figure 9:
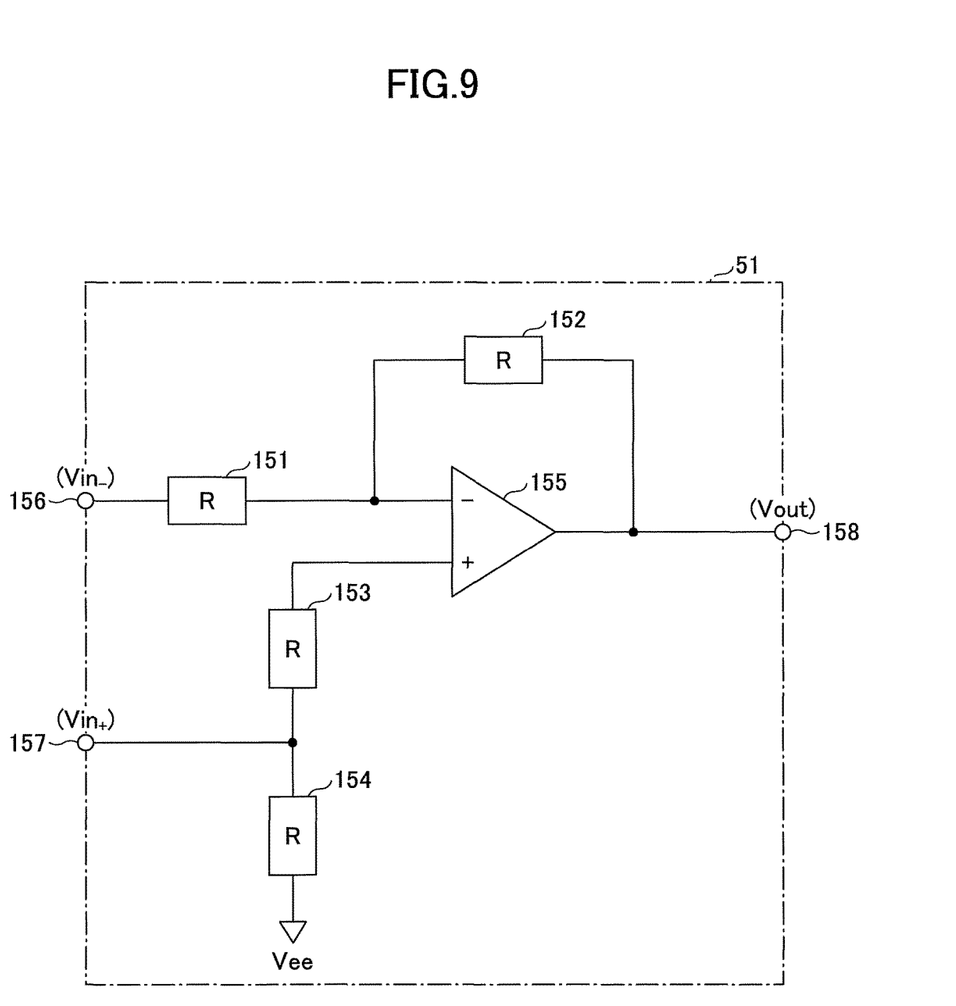
FIG. 9 is a circuit diagram of a subtraction circuit.

As illustrated in FIG. 9, the subtraction circuit 51 may be formed by four resistors 151, 152, 153, and 154, and a differential amplifier circuit 155. The resistor 151 is connected to a − input terminal 156 (Vin_) of the subtraction circuit 51. The other terminal of the resistor 151 is connected to an inverting input terminal (−) of the differential amplifier circuit 155 and also connected to the resistor 152. The output of the differential amplifier circuit 155 is connected to an output terminal 158 (Vout) of the subtraction circuit 51 and is also connected to the other terminal of the resistor 152. Furthermore, the resistor 153 and the resistor 154 are connected in series. The resistor 153 is connected to a noninverting input terminal (+) of the differential amplifier circuit 155 and the +input terminal 157 (Vin_+) of the subtraction circuit 51. Furthermore, the resistor 154 is connected between the + input terminal 157 and the ground potential.

In the subtraction circuit 51 illustrated in FIG. 9, the relationship between the potential Vin_ at the − input terminal 156 and the potential Vin_+ at an + input terminal 157 and the Vout at an output terminal 158, is expressed by formula 8.

$$Vout = Vin_+ - Vin_- \quad \text{[Formula 8]}$$

Figure 10:
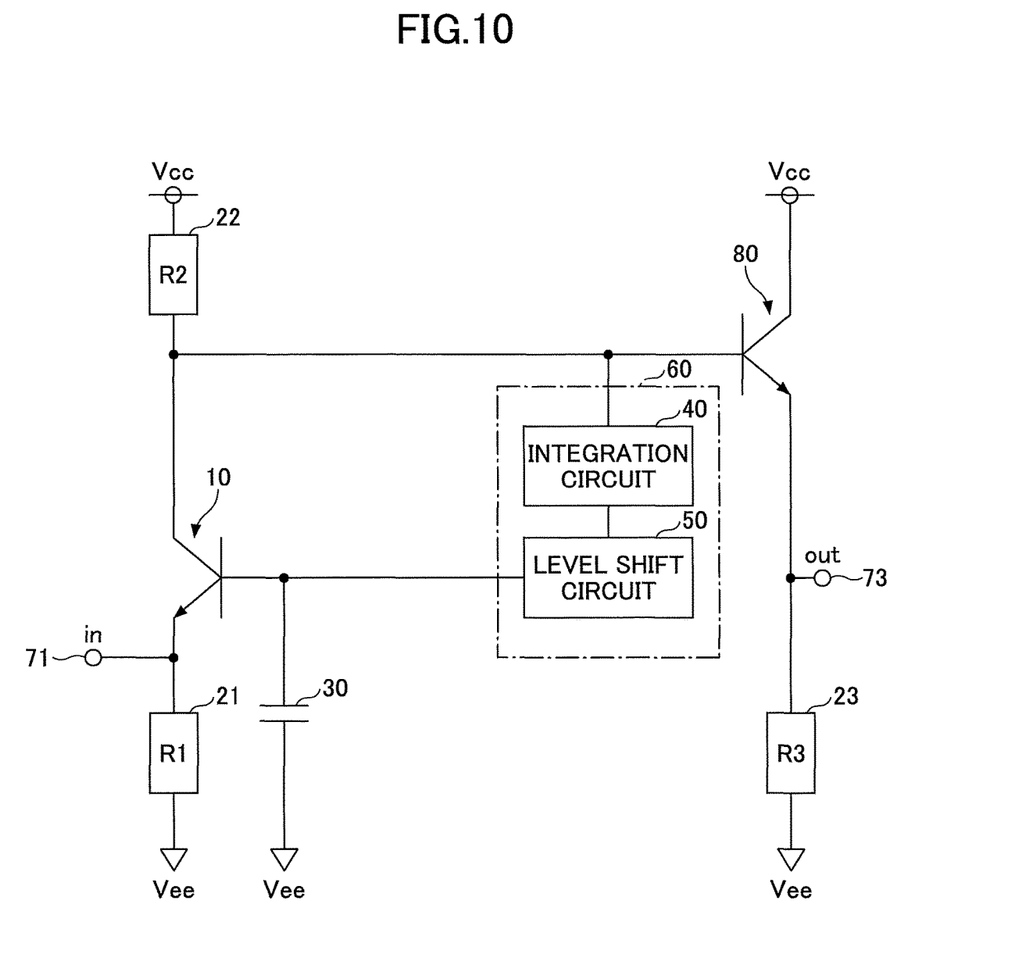
FIG. 10 is a circuit diagram (3) of an amplifier circuit according to the first embodiment of the present invention.

Furthermore, as illustrated in FIG. 10, the amplifier circuit according to the present embodiment may be an emitter follower circuit in which a second transistor 80 is connected. Accordingly, impedance conversion can be performed, the output impedance can be lowered, and a large amount of current can be passed.

Specifically, the base of the second transistor 80 is connected to the output terminal of the amplifier circuit illustrated in FIG. 3. That is, the portion where the second resistor 22 is connected to the collector of the first transistor 10, is connected to the base of the second transistor 80. Furthermore, a third resistor 23 is connected to the emitter of the second transistor 80 and also connected to an output terminal 73 of the amplifier circuit. Note that the collector of the second transistor 80 is connected to the second potential Vcc and the other terminal of the third resistor 23 is connected to the first potential Vee. Note that the resistance value R3 of the third resistor 23 is, for example, 1 kΩ.

Second Embodiment

Next, an amplifier circuit according to a second embodiment will be described.

Figure 11:
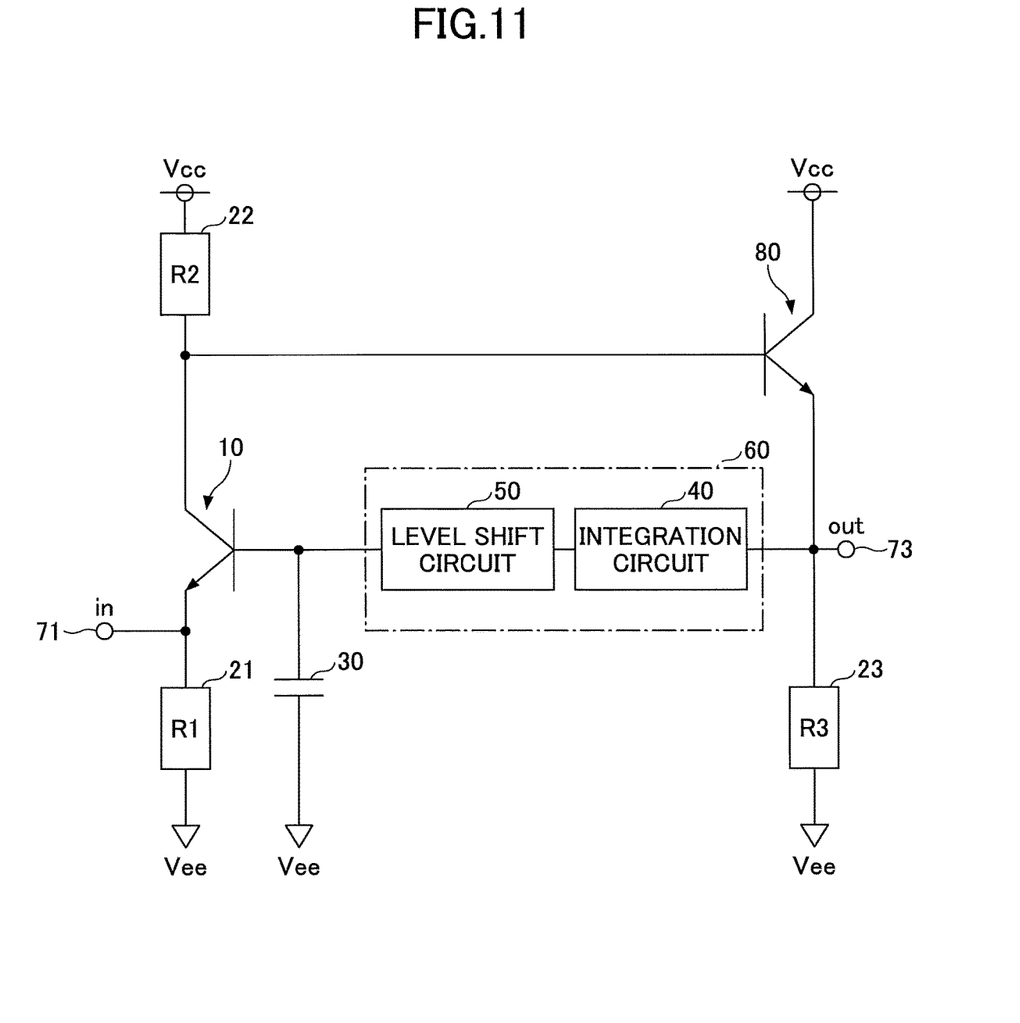
FIG. 11 is a circuit diagram (1) of an amplifier circuit according to a second embodiment of the present invention.

In the present embodiment, the integration circuit 40 connected to the collector of the first transistor 10, is connected to the emitter of the second transistor 80 as illustrated in FIG. 11. By inputting the output of the second transistor 80 to the integration circuit 40, the load of the first transistor 10 can be reduced and the frequency characteristic can be improved compared to the amplifier circuit illustrated in FIG. 10. Note that when there are no signals, the base potential of the first transistor 10 is approximately 1.5 V, the collector potential is approximately 2.5 V, and the emitter potential of the second transistor 80 is approximately 1.8 V.

Figure 12:
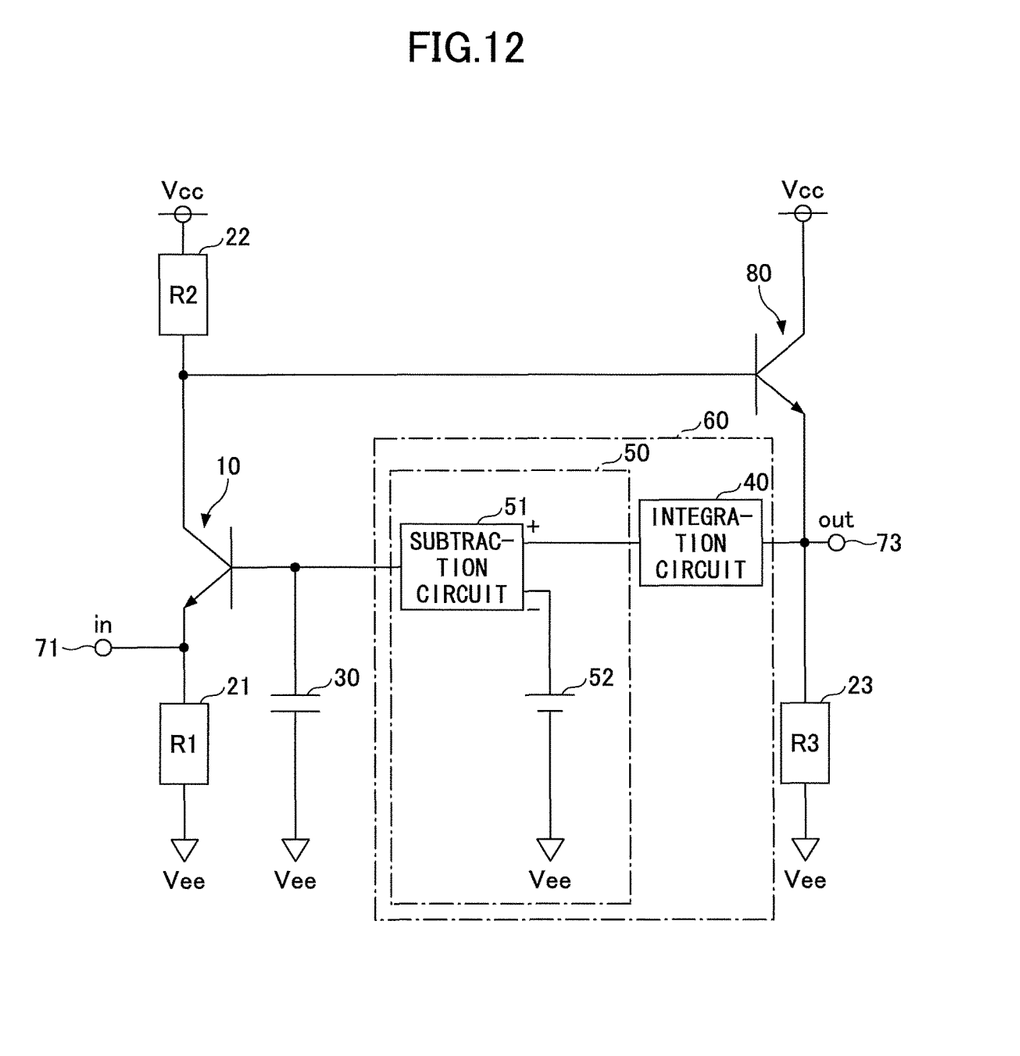
FIG. 12 is a circuit diagram (2) of an amplifier circuit according to the second embodiment of the present invention.

FIG. 12 is a circuit diagram in which the level shift circuit 50 illustrated in FIG. 11 is formed by the subtraction circuit 51 and the power supply 52. The output of the integration circuit 40 is connected to the +input terminal of the subtraction circuit 51, and a potential of 0.8 V, which is the third potential, is applied from the power supply 52 to the − input terminal of the subtraction circuit 51.

Note that contents other than those described above are the same as those of the first embodiment.

Third Embodiment

Next, an amplifier circuit according to a third embodiment will be described. In this amplifier circuit, an integration circuit and a level shift circuit are formed by a digital circuit.

Figure 13:
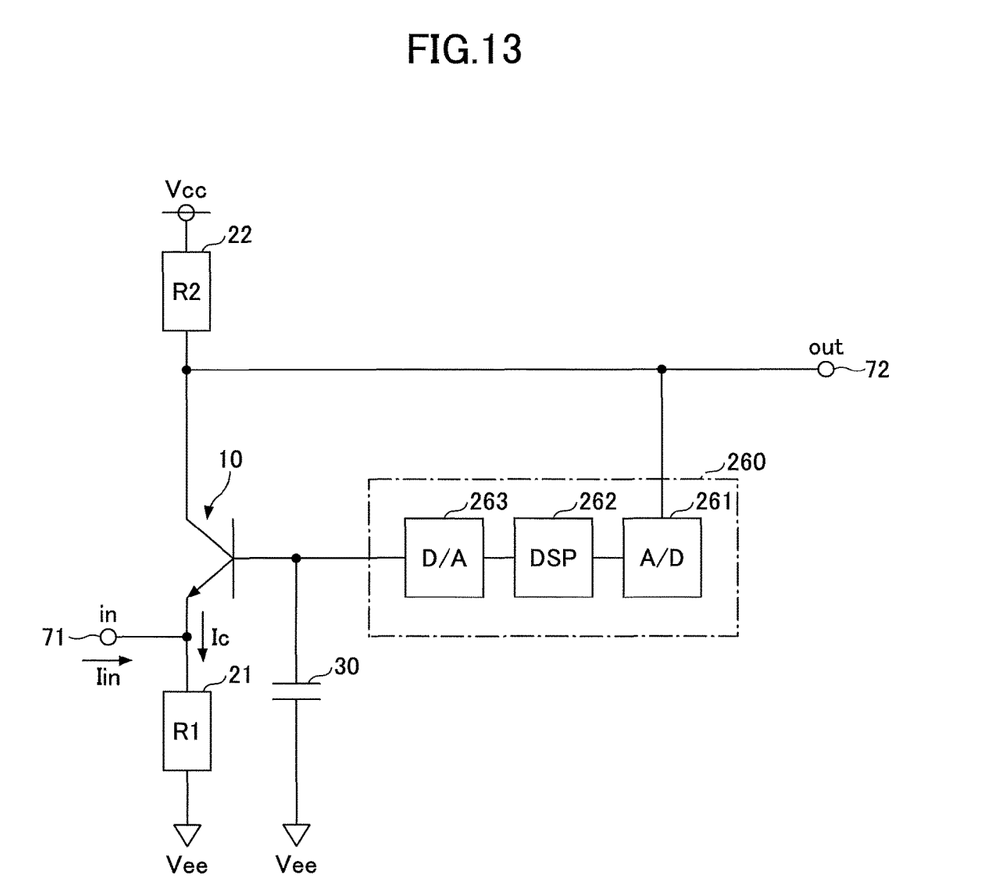
FIG. 13 is a circuit diagram (1) of an amplifier circuit according to a third embodiment of the present invention.

As illustrated in FIG. 13, the amplifier circuit according to the present embodiment includes a digital signal control circuit 260. The digital signal control circuit 260 includes an AD converter 261 (A/D), a digital signal processing unit 262 (DSP), and a DA converter 263 (D/A), etc. The collector of the first transistor 10 is connected to the input of the AD converter 261, and the output of the AD converter 261 is connected to the input of the digital signal processing unit 262. The output of the digital signal processing unit 262 is connected to the DA converter 263, and the output of the DA converter 263 becomes the output of the digital signal control circuit 260.

In the present embodiment, in the AD converter 261, the collector voltage of the first transistor 10 is converted from an analog signal into a digital signal, the digital signal processing unit 262 processes the digital signal, and the DA converter 263 converts the digital signal into an analog signal. The signal converted into the analog signal is input to the base of the first transistor 10. The digital signal control circuit 260 digitally performs the functions of the integration circuit and the level shift circuit.

Figure 14:
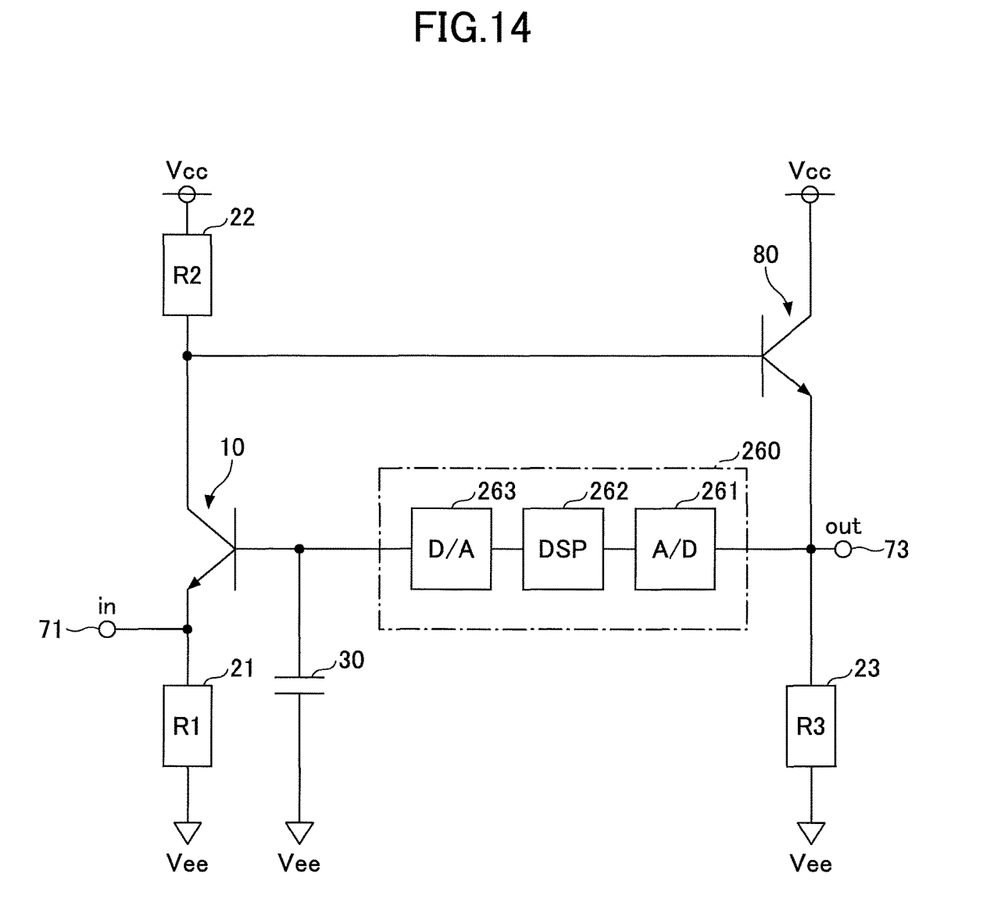
FIG. 14 is a circuit diagram (2) of an amplifier circuit according to the third embodiment of the present invention.

Note that FIG. 14 corresponds to the second embodiment. In FIG. 14, the integration circuit 40 and the level shift circuit 50 in the amplifier circuit illustrated in FIG. 11 are replaced by the digital signal control circuit 260.

According to an embodiment of the present invention, an amplifier circuit in which the input impedance does not change even if the magnitude of the input signal changes, can be provided.

The present invention is not limited to the specifically disclosed embodiment, and variations and modifications may be made without departing from the scope of the present invention.

What is claimed is:

1. An amplifier circuit comprising:
   a first transistor;
   a first resistor to which a first potential is applied, the first resistor being connected to an emitter of the first transistor;
   a second resistor to which a second potential is applied, the second resistor being connected to a collector of the first transistor; and
   a signal control circuit configured to apply, to a base of the first transistor, a voltage that has been level-shifted based on an average value of a voltage at the collector of the first transistor, the signal control circuit being provided between the collector and the base of the first transistor.

2. The amplifier circuit according to claim 1, further comprising:
   a second transistor including a base and a collector, wherein the second potential is applied to the collector of the second transistor and the base of the second transistor is connected to the collector of the first transistor; and
   a third resistor including terminals, wherein one of the terminals of the third resistor is connected to an emitter of the second transistor and the first potential is applied to another one of the terminals of the third resistor.

3. The amplifier circuit according to claim 2, wherein the signal control circuit includes:
   an AD converter configured to convert a voltage at the collector of the first transistor or at the emitter of the second transistor, into a digital signal;
   a digital signal processing unit configured to generate a digital signal of a voltage that has been level-shifted based on an average value of the voltage that has been converted into the digital signal; and
   a DA converter configured to convert the digital signal generated by the digital signal processing unit into an analog signal.

4. The amplifier circuit according to claim 2, wherein the signal control circuit includes:
   an integration circuit configured to calculate an average value of a voltage at the collector of the first transistor or at the emitter of the second transistor; and
   a level shift circuit configured to generate a voltage that has been level-shifted based on the average value calculated by the integration circuit.

5. The amplifier circuit according to claim 4, wherein
   the level shift circuit includes a subtraction circuit, and
   the subtraction circuit includes a differential amplifier circuit including input terminals, wherein a third potential is applied to one of the input terminals of the differential amplifier circuit and output of the integration circuit is connected to another one of the input terminals of the differential amplifier circuit.

* * * * *